(12) United States Patent
Kondapalli

(10) Patent No.: US 7,284,226 B1
(45) Date of Patent: Oct. 16, 2007

(54) METHODS AND STRUCTURES OF PROVIDING MODULAR INTEGRATED CIRCUITS

(75) Inventor: Venu M. Kondapalli, Sunnyvale, CA (US)

(73) Assignee: Xilinx, Inc., San Jose, CA (US)

(*) Notice: Subject to any disclaimer, the term of this patent is extended or adjusted under 35 U.S.C. 154(b) by 298 days.

(21) Appl. No.: 10/956,544

(22) Filed: Oct. 1, 2004

(51) Int. Cl.
G06F 17/50 (2006.01)
H01L 25/00 (2006.01)

(52) U.S. Cl. .............................. 716/16; 716/17; 326/41
(58) Field of Classification Search ............ 716/16–17; 326/41, 101
See application file for complete search history.

(56) References Cited

U.S. PATENT DOCUMENTS 5,914,616 A 6/1999 Young et al.
6,157,213 A * 12/2000 Voogel .................... 326/41

* cited by examiner

*Primary Examiner*—Paul Dinh
(74) *Attorney, Agent, or Firm*—Lois D. Cartier

(57) ABSTRACT

Modular wafers and integrated circuits (ICs), and methods of manufacturing modular ICs. A modular wafer can be optionally divided in various ways to avoid defects while producing a variety of modular ICs. A modular wafer includes an array of element dice separated by a scribe area. The scribe area includes interconnect lines that extend across the scribe area between each adjacent pair of the element dice. Unused interconnect lines can be pulled to a known value using weak pullups or pulldowns. Modular ICs can be manufactured with interconnect lines between each pair of adjacent element dice, in which case a single mask set can be used to manufacture a family of programmable logic devices (PLDs).

14 Claims, 14 Drawing Sheets

METHODS AND STRUCTURES OF PROVIDING MODULAR INTEGRATED CIRCUITS

FIELD OF THE INVENTION

The invention relates to integrated circuit devices (ICs). More particularly, the invention relates to methods and structures of manufacturing ICs in a modular fashion, such that an IC wafer can be optionally divided in various ways to produce a desired variety of modular ICs.

BACKGROUND OF THE INVENTION

Programmable logic devices (PLDs) are a well-known type of IC that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

FIG. 1 is a simplified illustration of an exemplary FPGA 100. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

A PLD interconnect structure can be complex and highly flexible. For example, Young et al. describe the interconnect structure of an exemplary FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

FPGA "families" are typically created by including differently-sized arrays of the same logic blocks. For example, the FPGA illustrated in FIG. 1 includes a 3×3 array of LBs. The arrays are typically much larger in actual devices, but a small array is illustrated in FIG. 1, for clarity. An FPGA device family might include, for example, one device with an 8×8 array, one device with an 8×16 array (or two 8×8 arrays), one device with a 16×16 array (or two 8×16 arrays), and so forth. A separate mask set is created for each member of the FPGA family, and each family member has a separate test program, a separate characterization program, separate packaging, and so forth.

Note that the FPGA illustrated in FIG. 1 is similar to other ICs in that the FPGA is surrounded by a "scribe line", "scribe", "scribe area", or "dieseal" 106. A scribe line is an area typically including many of the various processing layers that make up the FPGA die, e.g., the diffusion layers and all of the metal layers. There are no circuit structures in the scribe line, except that relatively small test structures and/or alignment marks can be inserted to assist in the fabrication and test processes. The scribe line is the area in which the die are sawn apart when wafer processing is complete. Therefore, structures located within the scribe line are typically destroyed during the manufacturing process.

FIG. 2 illustrates an exemplary wafer 200 including 37 dice, implementing 37 copies of FPGA 100 from FIG. 1. FIG. 2 also illustrates an exemplary pattern of defects 201 introduced during fabrication. The defects are illustrated as small squares containing an "X". During the manufacturing process, a wafer is typically tested prior to sawing the wafer into separate dice. Each die that includes a disabling defect is marked with a dot of ink 202. These dice are discarded prior to the packaging step. Note that with the defect pattern illustrated in FIG. 2, 14 dice are discarded, and 23 dice are passed for packaging.

As will be clear from FIG. 2, the larger the size of a die in proportion to the size of the wafer, the greater the chance that the die area will include one or more of the defects. Die sizes are generally increasing as the IC industry evolves. At the same time, the surface density of structures on the die is also increasing as minimum feature sizes are reduced, so each defect is more likely to occur in an area sensitive to such defects. Hence, manufacturing defects are an increasing problem in the manufacture of ICs, including FPGAs and other PLDs.

Therefore, it is desirable to provide methods and structures that increase the yield of die per wafer by minimizing the impact of manufacturing defects.

SUMMARY OF THE INVENTION

The invention provides methods of manufacturing integrated circuits (ICs) in a modular fashion, such that an IC wafer can be optionally divided in various ways to avoid defects while producing a desired selection of modular ICs. The modular ICs produced from a single wafer can all be the same size, or can be of different sizes, as desired. The invention also provides modular IC wafers and modular ICs.

According to one embodiment, a modular IC wafer or modular IC includes an array of element dice separated by a scribe area. The scribe area includes interconnect lines that extend across the scribe area between each adjacent pair of the element dice. Unused interconnect lines can be pulled to a known value using weak pullups or pulldowns. The element dice can be, for example, programmable logic devices (PLDs) such as field programmable gate arrays (FPGAs) or other PLDs. In some embodiments each PLD includes logic blocks incorporating programmable logic elements. The interconnect lines that extend across the scribe area couple together the programmable logic elements in two different element dice. Additional interconnections between the element dice of a modular IC can be made within the IC package level or at the board level, if desired.

A method of manufacturing modular ICs can include, for example, processing an IC wafer of element dice, testing the element dice to determine which are good dice and which are defective dice, determining a scribing pattern for the IC wafer based on locations of the defective dice within the IC wafer, and separating the IC wafer within the scribe area based on the scribing pattern to form the modular ICs. Each modular IC die includes at least one of the element dice. For example, the modular die from one IC wafer can include modular ICs consisting of 1, 2, 3, 4, 6, and/or 8 element dice. Thus, only one mask set is required, while yielding a large assortment of differently-sized modular ICs. This approach makes it possible to manufacture an entire "family" of PLDs, for example, while using only one mask set. To provide a more graduated range of device sizes within the product family, two or more differently-sized element dice can be used on different wafers, if desired.

According to another embodiment, modular ICs can be manufactured by partially processing an IC wafer of element dice, determining a scribing pattern for the IC wafer based on desired modular ICs to be provided from the IC wafer, adding at least one additional interconnect layer to the IC wafer, and separating the IC wafer within the scribe area based on the scribing pattern to form a plurality of the modular ICs. The additional interconnect layer includes interconnect lines that extend across the scribe area within each modular IC, between each adjacent pair of the element dice within the modular IC. Thus, the location of each resulting modular IC on the wafer and the number of element dice in each modular IC determines where the interconnect lines across the scribe line will be included and where they will be omitted during the latter part of the manufacturing process.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
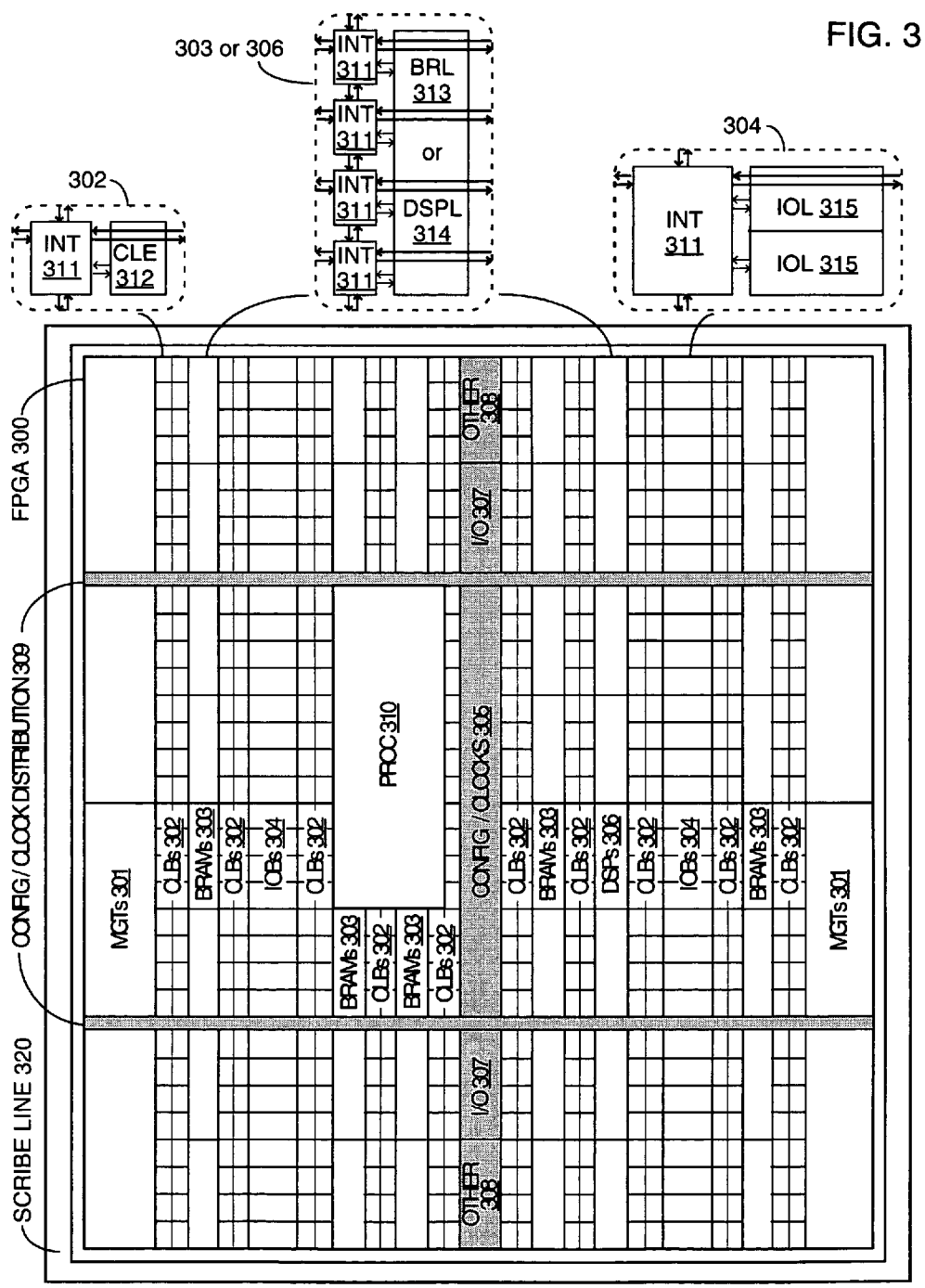
FIG. 3 is a block diagram of another exemplary FPGA architecture.

As noted above, advanced FPGAs can include several different types of programmable logic blocks in the array. For example, FIG. 3 illustrates an FPGA architecture 300 that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 are manufactured using metal layered above the various illustrated logic blocks, and typically are not confined to the area of the input/output logic element 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 1:
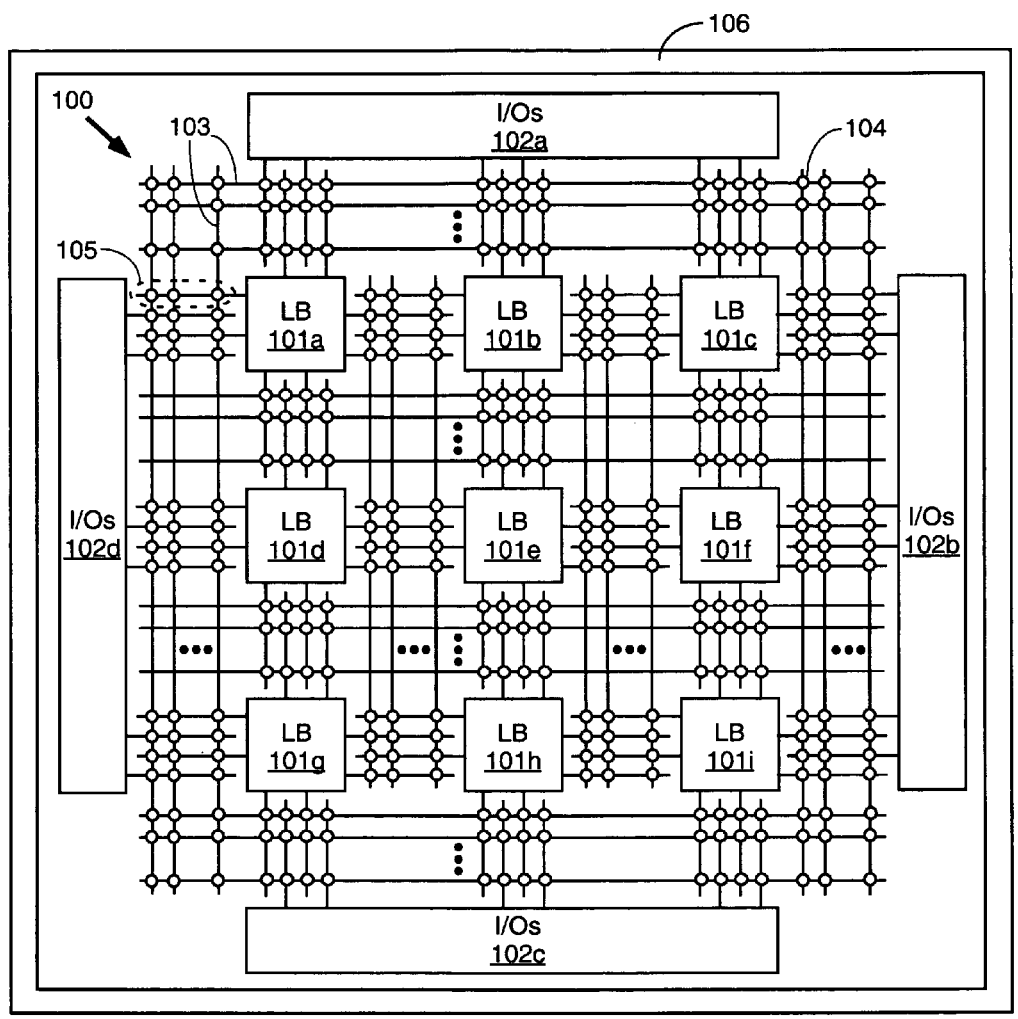
FIG. 1 illustrates an exemplary architecture for a known field programmable gate array (FPGA).

One way in which the columnar FPGA architecture of FIG. 3 differs from the FPGA architecture of FIG. 1 is in the location of the I/O blocks. In the architecture of FIG. 1, the I/O blocks are located around the perimeter of the die. Clearly, this arrangement works well for packages in which the package pins are located around the perimeter of the package. In the architecture of FIG. 3, the I/O blocks are located inside the body of the die, e.g., in columns as shown in FIG. 3. This type of die can be packaged in a "flip-chip" package, for example, in which the die is mounted face down in a package and makes contact with contact points distributed across the face of the package.

Figure 4:
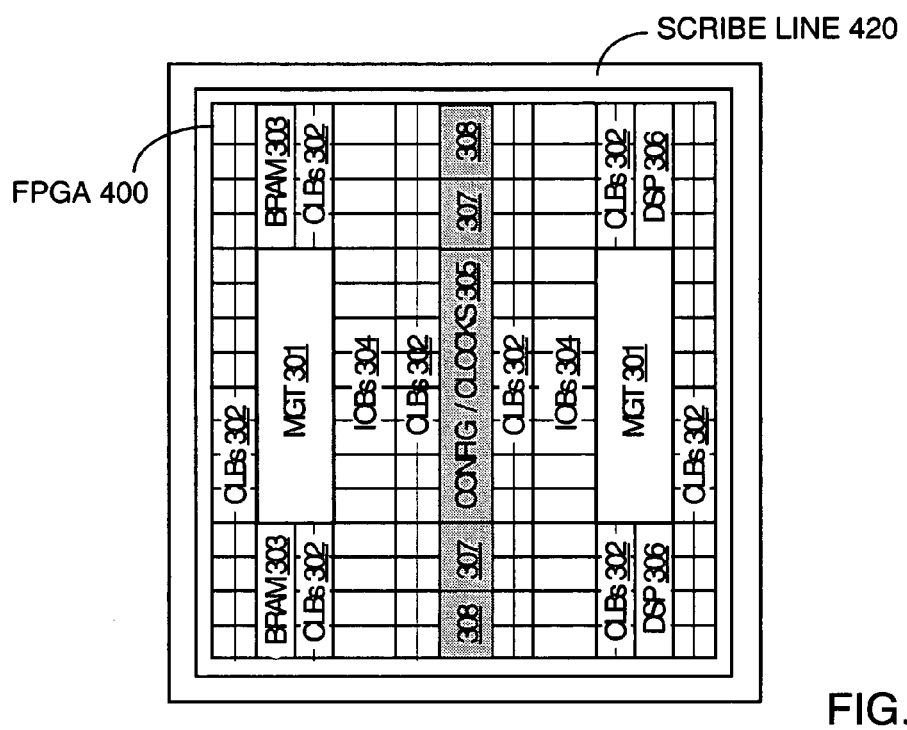
FIG. 4 is a block diagram of a modular FPGA architecture according to one embodiment.
Figure 13:
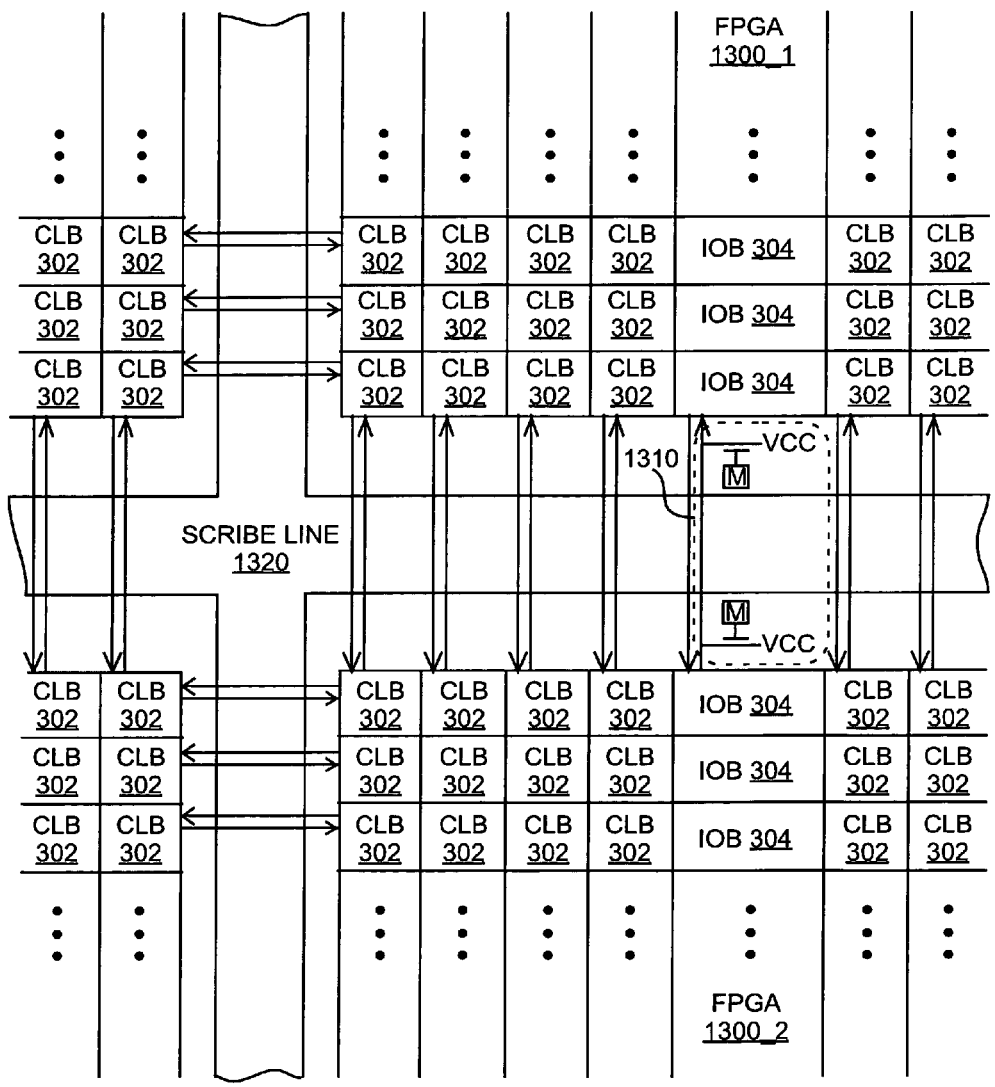
FIG. 13 illustrates one way in which the scribe lines of the modular FPGAs of FIGS. 4 and 8 can be implemented to facilitate a modular architecture.

FIG. 4 illustrates an FPGA similar to that shown in FIG. 3. FPGA 400 of FIG. 4 includes many of the same elements as shown in FIG. 3. However, fewer elements are included, resulting in an overall smaller die size. FPGA 400 of FIG. 4 is about half the width and half the height of FPGA 300 of FIG. 3, and includes about one fourth as much logic. Another difference is that in FIG. 4 the left- and right-most columns now include CLBs rather than MGTs. As shown in FIG. 13 and described in connection therewith, this arrangement facilitates a unique approach to the manufacture of modular PLDs. Note also that in the embodiment of FIG. 4 MGTs 301 are designed to allow for the passage of interconnect signals between the columns of logic on either side, unlike the MGTs included in the FPGA of FIG. 3. This can be accomplished, for example, by including programmable interconnect blocks 311 (see FIG. 3) in MGTs 301. FPGA 400 is surrounded by a scribe line 420. Note that the choice of logic blocks included in FPGA 400 is purely exemplary.

FPGA 400 of FIG. 4 provides an example of what are referred to herein as "element dice". An IC wafer manufactured in accordance with the present invention includes an array of the element dice. The wafer is separated into "modular ICs" that can include the same numbers or different numbers of the element dice. These modular ICs are created by separating the wafer (e.g., by sawing, or otherwise cutting or breaking) along some, but not all, of the scribe lines between the element dice. Clearly, an integral number of the element dice are included in each modular IC. For example, a modular IC can include an N×M array of the element dice that can be, for example, 1×1, 1×2, 1×3, 1×4, . . . , 2×1, 2×2, 2×3, 2×4, . . . 3×1, 3×2, 3×3, 3×4, and so forth. N is the number of rows in the array, and M is the number of columns in the array.

Note that FPGA 400 of FIG. 4 does not include exactly one-fourth of the elements in FPGA 300 of FIG. 3. For example, processor 310 is omitted from FPGA 400. Processor 310 provides an example of a logic block whose use does not scale with the product. In other words, it is common for an FPGA design to use at most one processor, regardless of the size of the FPGA. In a modular PLD it might be desirable to omit such logic blocks, as a modular PLD including eight element dice will perforce include eight processors, if a processor is included in each element die. It will be apparent to one skilled in the art after reading this specification that the present invention can be practiced within these and other architectural variations.

Figure 2:
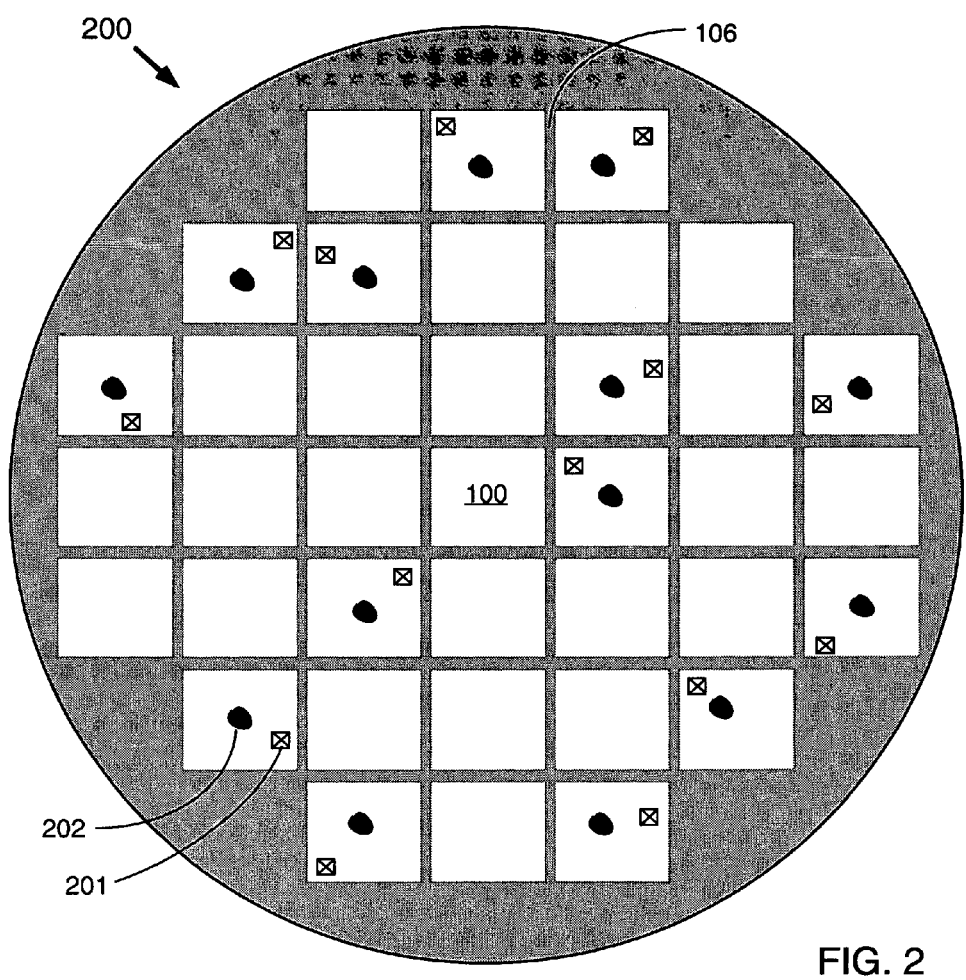
FIG. 2 illustrates a wafer of dice implementing the FPGA architecture illustrated in FIG. 1.
Figure 5:
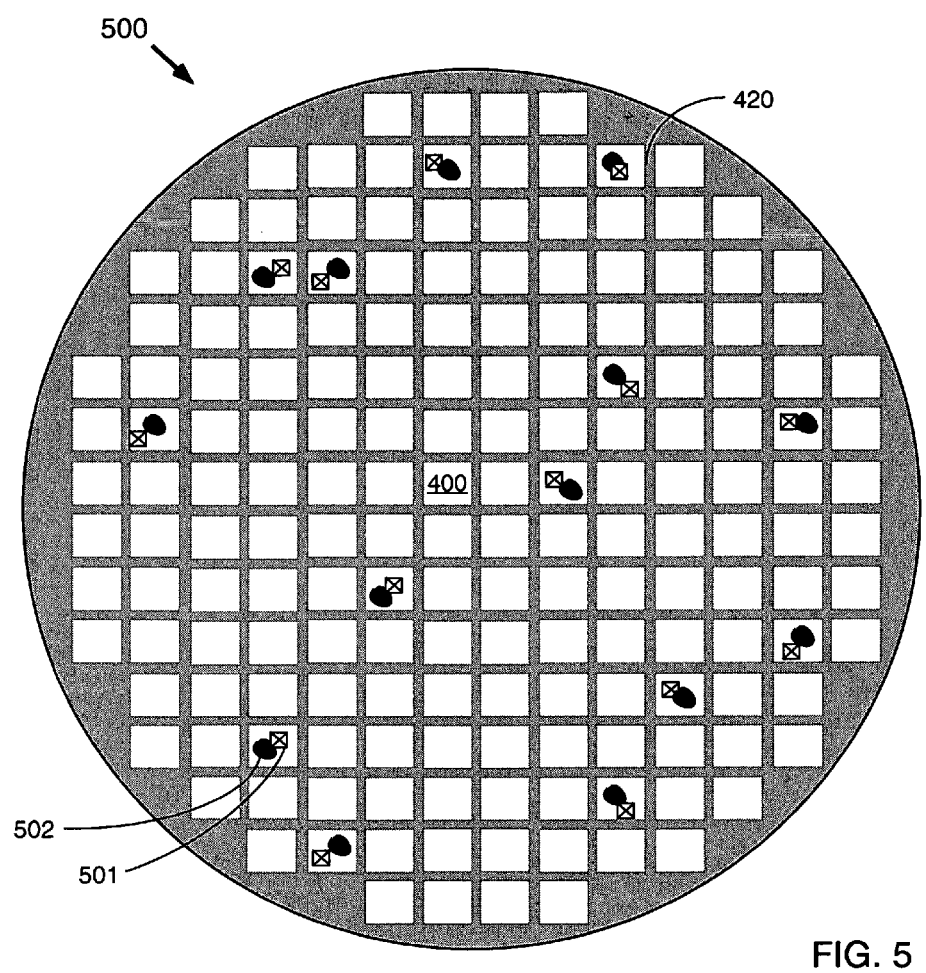
FIG. 5 illustrates a wafer of dice implementing the architecture illustrated in FIG. 4.

FIG. 5 illustrates an exemplary wafer including 176 element dice, e.g., implementing 176 copies of FPGA 400 from FIG. 4. The wafer shown in FIG. 5 is about the same size as the wafer shown in FIG. 2, and exhibits the same pattern of defects as the wafer of FIG. 2. As in FIG. 2, the defects 501 are illustrated as small squares containing an "X", and each die that includes a disabling defect is marked with a dot of ink 502. This uniformity is maintained to simplify the comparison process. Note that with the defect pattern illustrated in FIG. 5, 14 element dice are marked to be discarded prior to the packaging step. Therefore, 162 element dice are passed for packaging.

Figure 6:
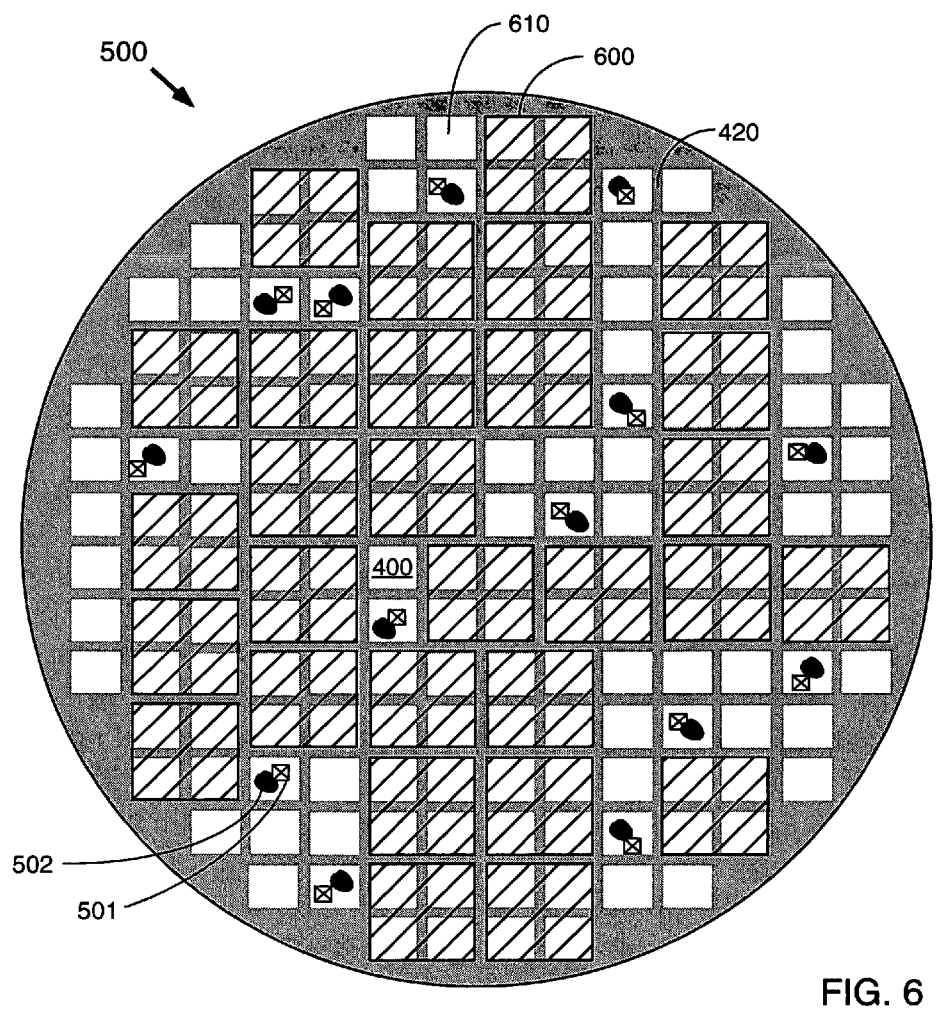
FIG. 6 illustrates one way in which the wafer of FIG. 5 can be scribed to produce a large number of 2×2 modular ICs.

If the desired modular IC corresponds approximately in size to FPGA 300 of FIG. 3, the desired modular IC includes four copies of element die 400, e.g., a 2×2 array of the element dice. FIG. 6 shows one way in which the wafer of FIG. 5 can be separated into modular ICs while avoiding the defective element dice. Each of the 29 resulting 2×2 modular ICs is indicated by a cross-hatched square 600. After separating the 2×2 modular ICs as shown in FIG. 6, there are 46 remaining element dice 610 that are not defective and are not included in any of the 2×2 modular ICs.

Figure 7:
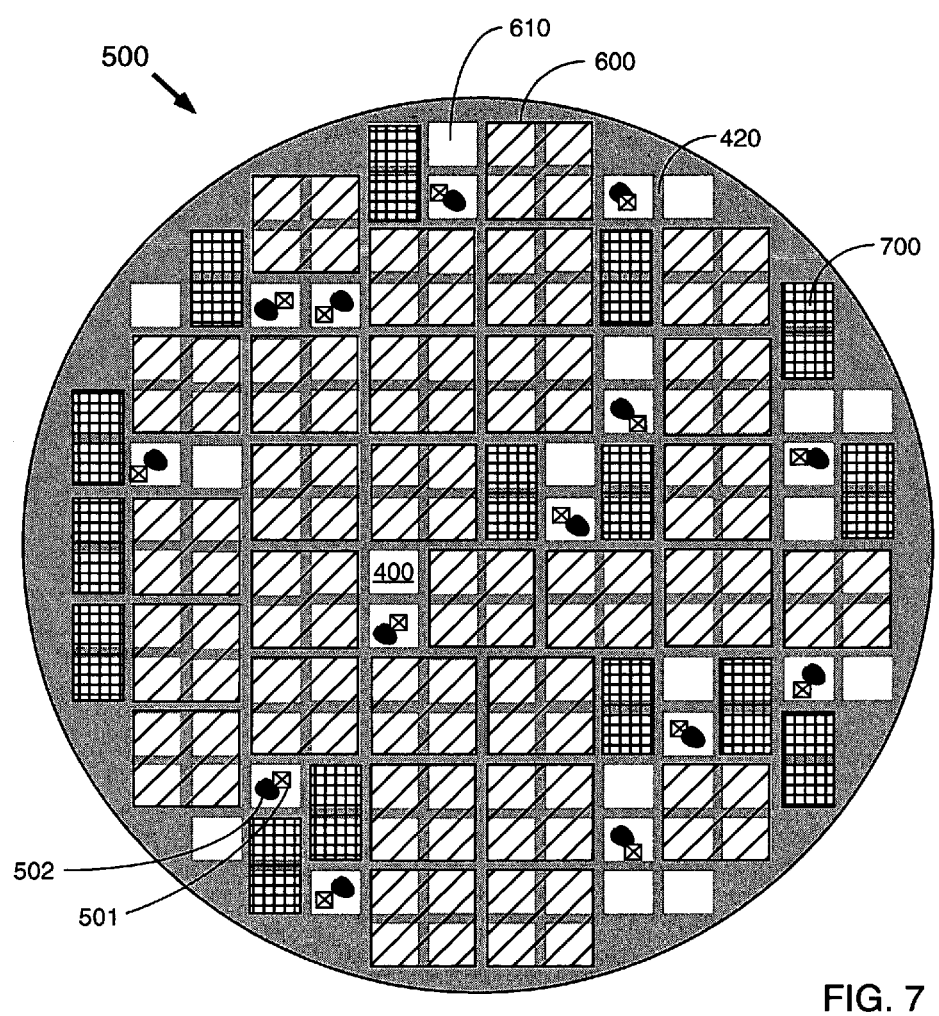
FIG. 7 illustrates a scribe pattern that can be applied to the wafer of FIGS. 5 and 6 to produce a number of 2×2, 1×2, and 1×1 modular ICs.

However, the present invention is highly flexible in that the remaining element dice can also be used to implement modular ICs of other sizes, if desired. (Clearly, some or all of the 2×2 modular ICs 600 could also be separated to form smaller modular ICs, if desired.) FIG. 7 illustrates one way in which the wafer of FIGS. 5 and 6 can be separated into modular ICs of various sizes while avoiding the defective element dice. The exemplary scribing pattern of FIG. 7 yields a total of 29 2×2 modular ICs 600, 15 1×2 modular ICs 700, and 16 1×1 modular ICs 610 (the same as the element die 400).

Note that when the modular ICs are PLDs, as in the example of FIGS. 4-7, a family of variously-sized PLDs can be created using a single mask set. Given the significant cost of a single mask set for the IC manufacturing processes now in use, a reduction in the number of required masks can represent a substantial reduction in the development costs of a PLD family. Further, note that test patterns need be developed for only a single element die and only one element die must be characterized, resulting in an even greater reduction in development costs.

The element die of FIG. 4 could be used to generate a PLD family, e.g., as shown in Table 1. For this example, it is assumed that the element die supports a user design that includes 100,000 logic gates.

TABLE 1

| No. Element Die | Array Size | No. Logic Gates Supported |
|---|---|---|
| 1 | 1×1 | 100,000 |
| 2 | 2×1 | 200,000 |
| 4 | 2×2 | 400,000 |

Figure 8:
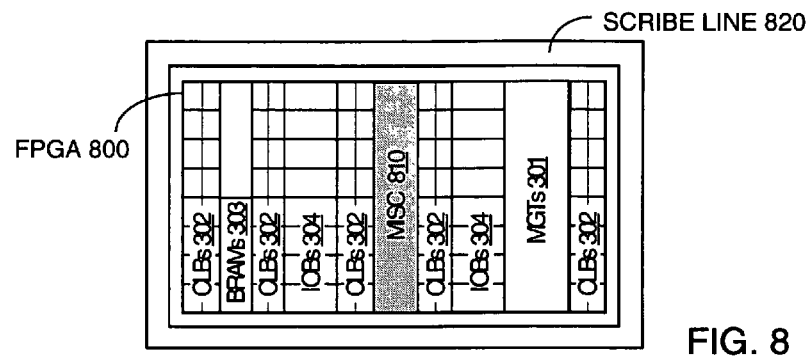
FIG. 8 is a block diagram of another modular FPGA architecture according to one embodiment.

FIGS. 8-12 provide an example of an element die having a different aspect ratio, approximately 2-to-1. The element die shown in FIG. 8 is about twice as wide as it is tall, allowing more vertical "stacking" of the element die before the aspect ratio of the resulting modular ICs becomes undesirable. IC die that are much larger in one dimension than the other can cause problems, e.g., problems related to packaging technology. Therefore, it is desirable to enable the creation of variously-sized modular ICs without highly asymmetrical aspect ratios.

FIG. 8 illustrates an FPGA similar to that shown in FIG. 4. FPGA 800 of FIG. 8 includes many of the same elements as shown in FIG. 3. However, fewer elements are included, resulting in an overall smaller die size. FPGA 800 of FIG. 8 is about the same width and half the height of FPGA 400 of FIG. 4, and includes about half as much logic. FPGA 800 is surrounded by a scribe line 820. Note that the choice of logic blocks included in FPGA 800 is purely exemplary. For simplicity, the configuration logic, clocking logic, and other miscellaneous logic are all designated as the miscellaneous logic block MISC 810 in FIG. 8.

Figure 9:
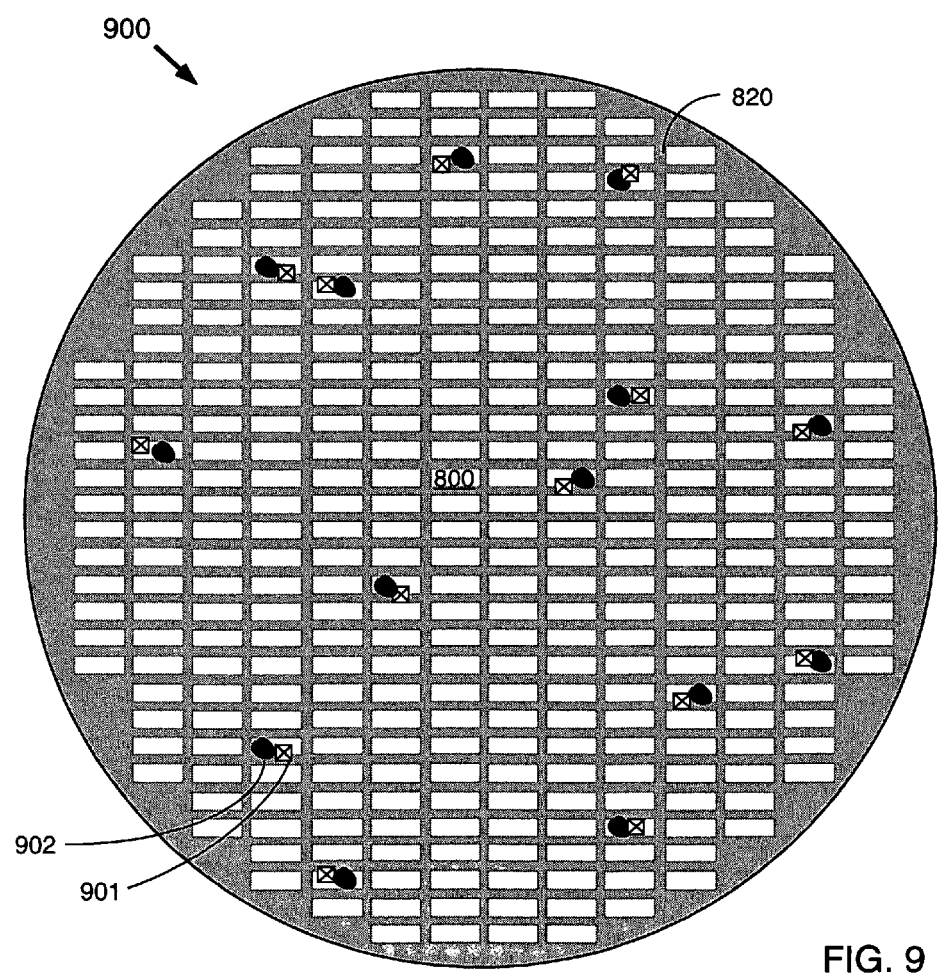
FIG. 9 illustrates a wafer of dice implementing the architecture illustrated in FIG. 8.

FIG. 9 illustrates an exemplary wafer including 356 of the element die 800 shown in FIG. 8. The wafer shown in FIG. 9 is about the same size as the wafer shown in FIGS. 2 and 5-7, and exhibits the same pattern of defects as these wafers, for exemplary purposes. The defects 901 are illustrated as small squares containing an "X", and each die that includes a disabling defect is marked with a dot of ink 902. This uniformity is maintained to simplify the comparison process. Note that with the defect pattern illustrated in FIG. 9, 14 element dice are marked to be discarded prior to the packaging step. Therefore, 342 element dice are passed for packaging.

Figure 10:
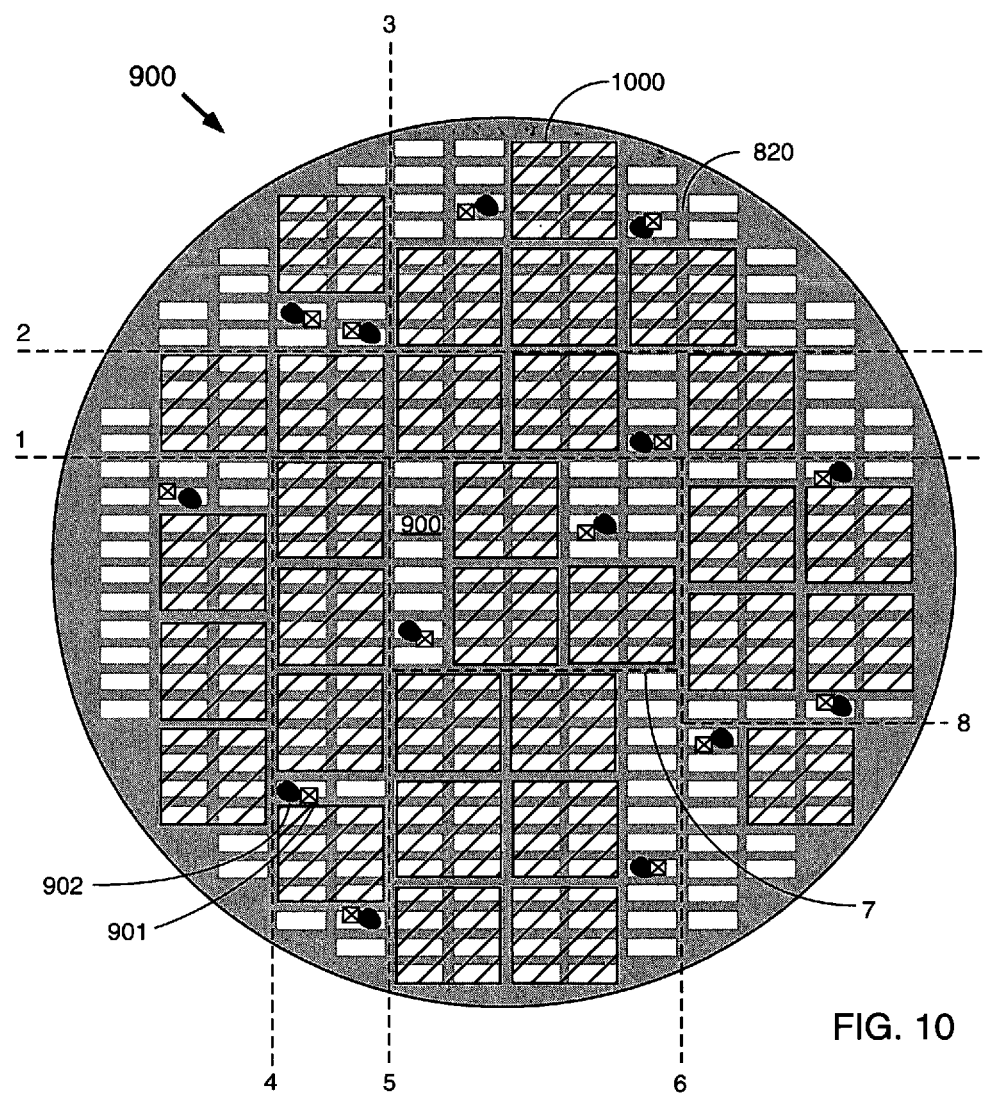
FIG. 10 illustrates one way in which the wafer of FIG. 9 can be scribed to produce a large number of 2×4 modular ICs.

If the desired modular IC corresponds approximately in size to FPGA 300 of FIG. 3, the desired modular IC includes eight copies of element die 800, e.g., a 4×2 array of the element dice. FIG. 10 shows one way in which the wafer of FIG. 9 can be separated into modular ICs while avoiding the defective element dice. Each of the 31 resulting 4×2 modular ICs is indicated by a cross-hatched square 1000. After separating the 4×2 modular ICs as shown in FIG. 10, there are 94 remaining element dice that are not defective and are not included in any of the 4×2 modular ICs.

FIG. 10 also illustrates some of the wafer cuts that can be used to separate the modular IC dice one from another. By making cuts 1-8 in order as shown, for example, the IC wafer is reduced to a group of partial wafers that can be scribed using a simple checkerboard pattern.

Figure 11:
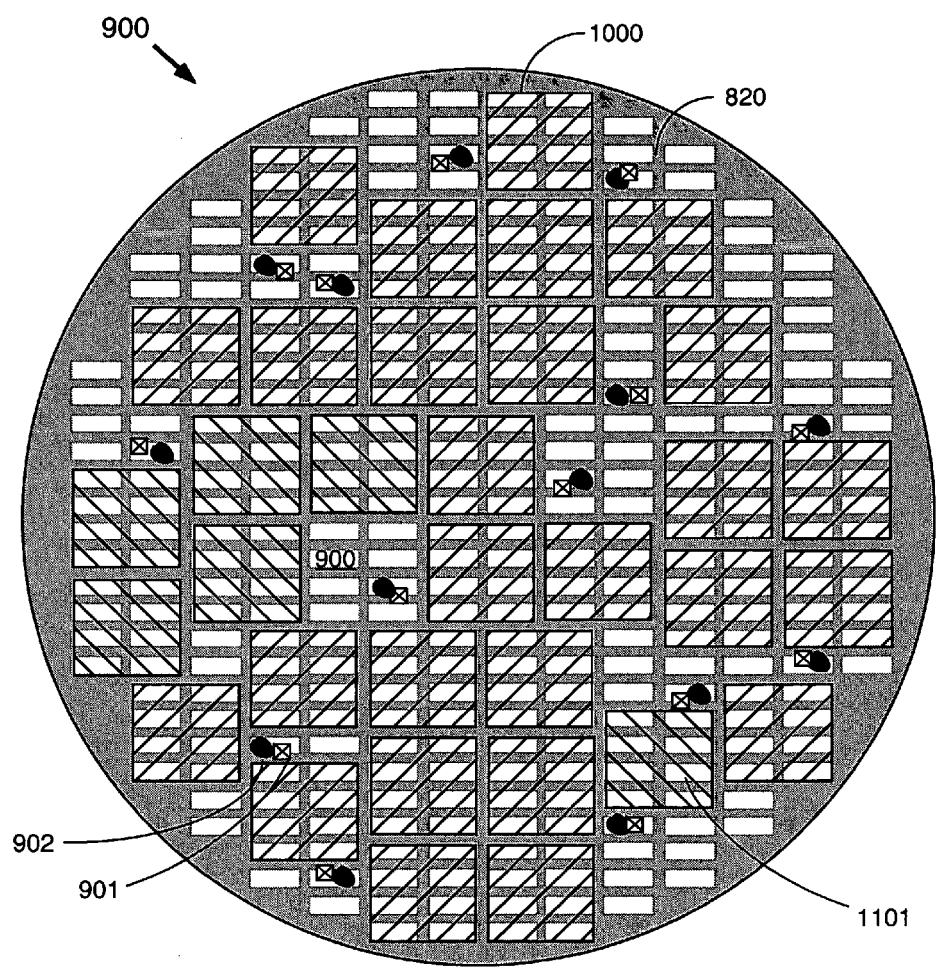
FIG. 11 illustrates a less desirable way in which the wafer of FIG. 9 can potentially be scribed to produce a larger number of 2×4 modular ICs.

Note that not every scribing pattern is equally suitable. Some scribing patterns would require that the wafer be sawn only partially across the wafer, forming a 90 degree angle cut. One such scribing pattern is shown in FIG. 11, for example, which in theory yields 33 4×2 modular ICs, but in which modular IC 1101 (for example) cannot be extracted without using a 90 degree angle cut. Such cuts are not generally considered practical using the scribing techniques now in general use, e.g., sawing, but might in future become commercially viable using more advanced techniques, e.g., chemical etching. All scribing techniques that are currently known or yet to be developed are encompassed by the present invention. However, in some embodiments it can be desirable to select a scribing pattern that results in a smaller number of the larger modular ICs, to avoid undesirable 90-degree cuts. Clearly, it might also be desirable to deliberately select smaller modular ICs for other reasons, such as market demand, for example.

Figure 12:
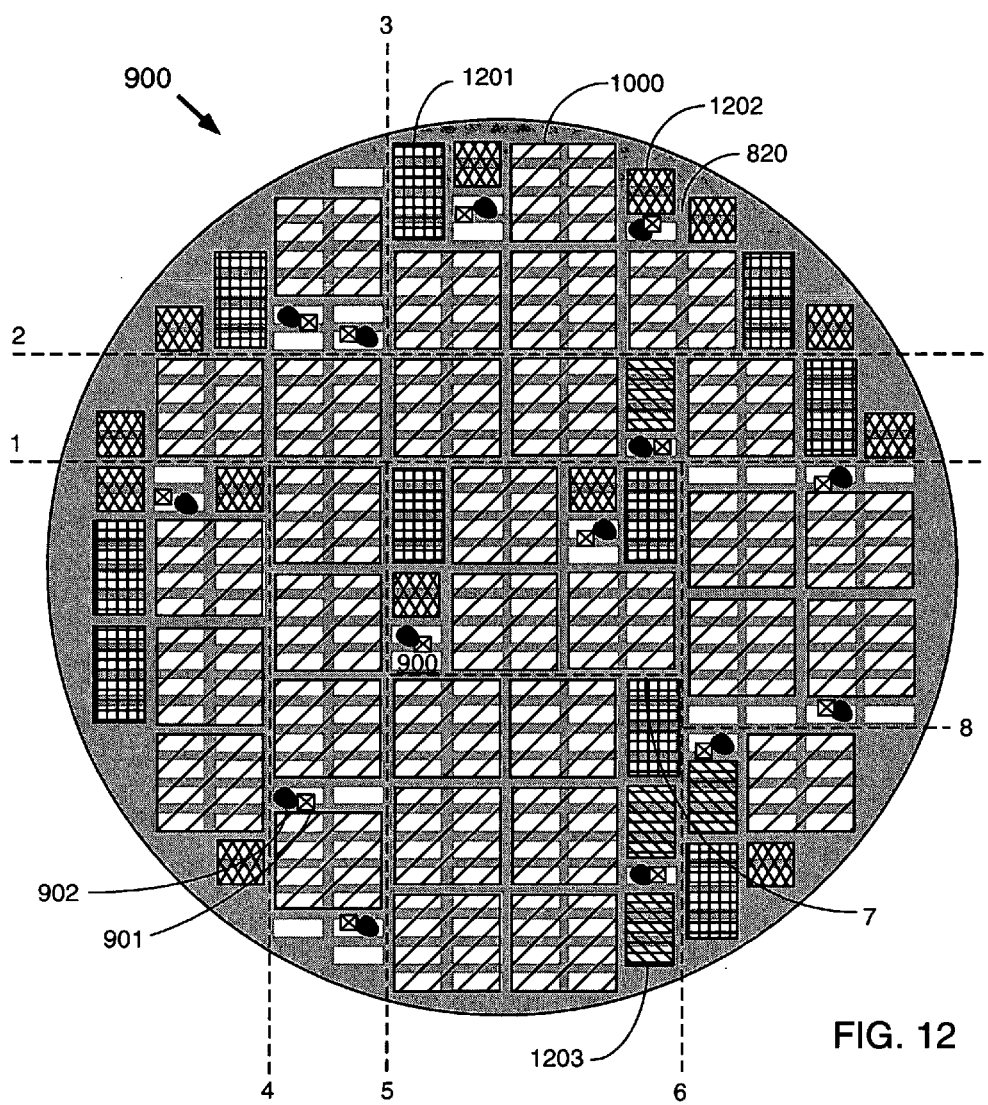
FIG. 12 illustrates a scribe pattern that can be applied to the wafer of FIGS. 9 and 10 to produce a number of 2×4, 1×4, 1×3, 1×2, and 1×1 modular ICs.

FIG. 12 illustrates one way in which the wafer of FIGS. 9 and 10 can be separated into modular ICs of various sizes while avoiding the defective element dice. The exemplary scribing pattern of FIG. 12 yields a total of 31 4×2 modular ICs 1000, 10 4×1 modular ICs 1201, 4 3×1 modular ICs 1203, 13 2×1 modular ICs 1202, and 16 1×1 modular ICs (the same as the element die 900). Other sizes of modular ICs could also be generated from this illustrated wafer. For example, no 3×2 modular ICs are shown in FIG. 11, but they could easily be generated in lieu of some of the selected sizes.

The element die of FIG. 8 could be used to generate a PLD family, e.g., as shown in Table 2. For this example, it is assumed that the element die supports a user design that includes 50,000 logic gates.

TABLE 2

| No. Element Die | Array Size | No. Logic Gates Supported |
|---|---|---|
| 1 | 1×1 | 50,000 |
| 2 | 2×1 | 100,000 |
| 3 | 3×1 | 150,000 |
| 4 | 4×1 | 200,000 |
| 6 | 3×2 | 300,000 |
| 8 | 4×2 | 400,000 |

Note that the PLD family of Table 2 offers a more complete range of size options than the PLD family of Table 1. However, the smaller element die size that permits this greater flexibility comes at a price. A scribe line is included between each adjacent pair of element dice, and the width of the scribe line does not scale with the size of the element die. In other words, the smaller the element die, the larger the proportion of the wafer area that is devoted to the scribe area. (Note that this effect is not shown in the figures herein, for simplicity.) The most desirable die size for the element die depends on the situation, and can take this effect into account along with other factors such as market demand and the sizes of the programmable elements in the PLD.

One way in which to provide a more comprehensive range of PLD sizes is to provide two different element dice. Preferably, each element die is manufactured on different wafers, i.e., each wafer includes only one type of element die. For example, one element die could accommodate 75,000 logic gates, while the other element die could accommodate 100,000 logic gates. Table 3 shows an exemplary PLD family that can be derived from these two element dice. If desired, the two element dice could also be designed to include different features, e.g., different logic blocks, and/or different proportions of the various included logic blocks. In some embodiments, more than two different element dice are used to create a family of modular ICs.

TABLE 3

| No. Element Die #1 | No. Element Die #2 | Array Size | No. Logic Gates Supported |
|---|---|---|---|
| 1 | 0 | 1×1 | 75,000 |
| 0 | 1 | 1×1 | 100,000 |
| 2 | 0 | 2×1 | 150,000 |
| 0 | 2 | 2×1 | 200,000 |
| 3 | 0 | 3×1 | 225,000 |
| 0 | 3 | 3×1 | 300,000 |
| 0 | 4 | 2×2 | 400,000 |
| 6 | 0 | 3×2 | 450,000 |
| 0 | 6 | 3×2 | 600,000 |
| 9 | 0 | 3×3 | 675,000 |
| 0 | 8 | 4×2 | 800,000 |
| 0 | 9 | 3×3 | 900,000 |

FIG. 13 provides an example of how the element die in an modular IC can be interconnected, according to one embodiment. Note that in the pictured embodiment each CLB 302 and IOB 304 includes a programmable interconnect element such as element 311 of FIG. 3. Each interconnect element located along an edge of the element die is coupled not only to the logic blocks immediately adjacent to the interconnect element, but also to the logic blocks across the scribe line 1320. For example, each CLB and IOB along the bottom edge of FPGA 1300_1 is coupled to a corresponding CLB or IOB along the top edge of FPGA 1300_2.

In the pictured embodiment, all peripheral logic blocks that include the standard interconnect element 311 are coupled across the scribe line 1320. The corner logic blocks are coupled both vertically and horizontally across the scribe line, as shown in FIG. 13. Therefore, in this embodiment the interconnect structure is simply continued in the standard fashion across the scribe line. In some embodiments, more global signals such as configuration and clocking signals are not continued across the scribe line, but are separately provided to each element die.

As previously described, in known ICs the scribe line includes all metal layers provided by the process. In the embodiment of FIG. 13, the process provides 10 metal layers. Only the first five metal layers are included in the scribe line. The remaining five metal layers are used to implement the interconnect lines that cross the scribe line. In other embodiments, more or fewer than five processing layers are used to implement the interconnect lines across the scribe line.

In some embodiments, the scribe line is sufficiently wide to appreciably slow the speed of an unbuffered signal crossing the scribe line. In some of these embodiments, interconnect signals are buffered prior to crossing the scribe line.

As has been described, some interconnections between the various element dice in a single modular IC are accommodated by extending interconnect lines across the scribe lines, as shown in FIG. 13. However, some interconnections between the element dice can also be accommodated either within the package, or at the board level. For example, the element dice of FIGS. 4 and 8 include configuration logic that is used to supply configuration data to the configuration memory cells of the PLD. In some embodiments, each element die is separately configured through package pins that couple to configuration I/Os of the element die.

In some embodiments, the modular IC is configured as a single entity, e.g., using a single configuration bitstream. As each element die in a modular IC is powered up and becomes operational, the configuration logic of each element die sends out a probe signal across the scribe lines to all adjacent element dice. Where the interconnect lines have not been severed, the probe signal is interpreted and the two adjacent element dice can "talk" to one another via a handshaking signal. When a handshaking signal is detected, a preset algorithm moves the control of the configuration logic port in a fixed direction, e.g., to the left and up. At the end of the probing and handshaking, all configuration blocks have passed control of the configuration port to the top-left configuration block of the modular IC.

In some embodiments, global clock signals are separately provided to each element die. This method of distributing clock signals avoids having variable loading (and hence variable clock delays and skews) for the various sizes of modular ICs. In other embodiments, global clock signals are applied to the entire modular IC using a probing and handshaking technique similar to that described above.

The embodiment of FIG. 13 is well suited, for example, to PLDs. In a PLD, unused interconnect lines are typically held at a known value, e.g., a power high value. Thus, the design implementation software for a modular PLD can simply be told that any interconnect line crossing a scribe line around the periphery of the modular PLD is to be left unused, and the interconnect line will be driven to a known value. Any shorts that might occur between interconnect lines as a result of the die separation process (e.g., sawing down the scribe line) are immaterial.

In some embodiments where the interconnect lines that cross the scribe line carry changing signal values, it can be desirable to require a larger-than-minimal separation between the interconnect lines, to minimize the adverse effects of the separation procedure.

In some embodiments, weak pullups or pulldowns are added to each interconnect line that crosses the scribe area, to ensure that unused interconnect lines all have a known value. In some embodiments, all unused interconnect lines crossing a scribe area are pulled to the same value (e.g., a high value or a low value) to prevent shorts between power high and ground if adjacent interconnect lines are shorted together by the scribing process. Thus, all unused interconnect lines assume the same predetermined value when the element dice driving the interconnect lines fail to provide an alternative signal value to the interconnect line. In some embodiments, the weak pullups and pulldowns are programmable, so they can be optionally disabled for interconnect lines crossing scribe areas between two dice that are packaged as a single unit. For example, area 1310 of FIG. 13 shows how interconnect lines can be optionally pulled to a high value (VCC) using programmable weak pullups.

Figure 14:
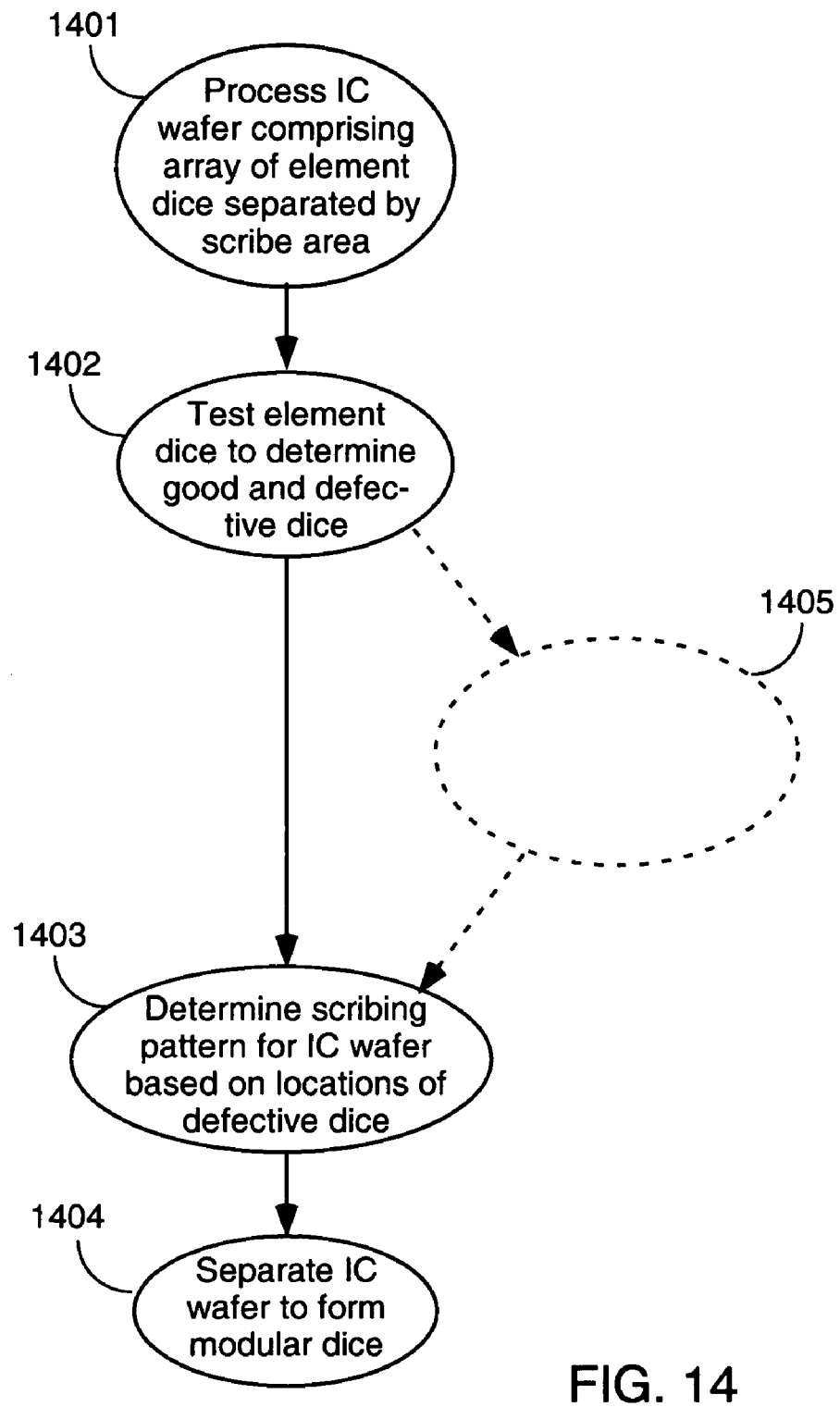
FIG. 14 illustrates the steps of a first exemplary method of manufacturing a modular integrated circuit (IC), according to one embodiment.

FIG. 14 illustrates the steps of one method of manufacturing modular ICs, in which interconnect lines are provided across the scribe lines between each adjacent pair of element die. In step 1401, an IC wafer is processed. The IC wafer includes an array of element dice separated by a scribe area. Included in the scribe area are interconnect lines that extend across the scribe area between each adjacent pair of the element dice.

In step 1402, the element dice are tested to determine which are good dice and which are defective dice. For example, the dice that fail the testing can be marked with a dot of ink.

In step 1403, a scribing pattern is determined for the IC wafer based at least in part on the locations of the defective dice within the IC wafer.

In step 1404, the IC wafer is separated into modular ICs as determined by the scribing pattern. Each modular IC includes at least one of the element dice.

If desired, the IC wafer can be stored before or after the testing step 1402 until needed (optional step 1405). In some embodiments, the scribing pattern also takes into account external factors such as market demand. The IC wafer can be stored, for example, until a desired number of element dice in a modular IC or a desired proportion of various sizes has been determined, based on market demand.

In some embodiments, the scribing pattern is simply selected to yield the largest possible number of the modular ICs of a certain size.

Figure 15:
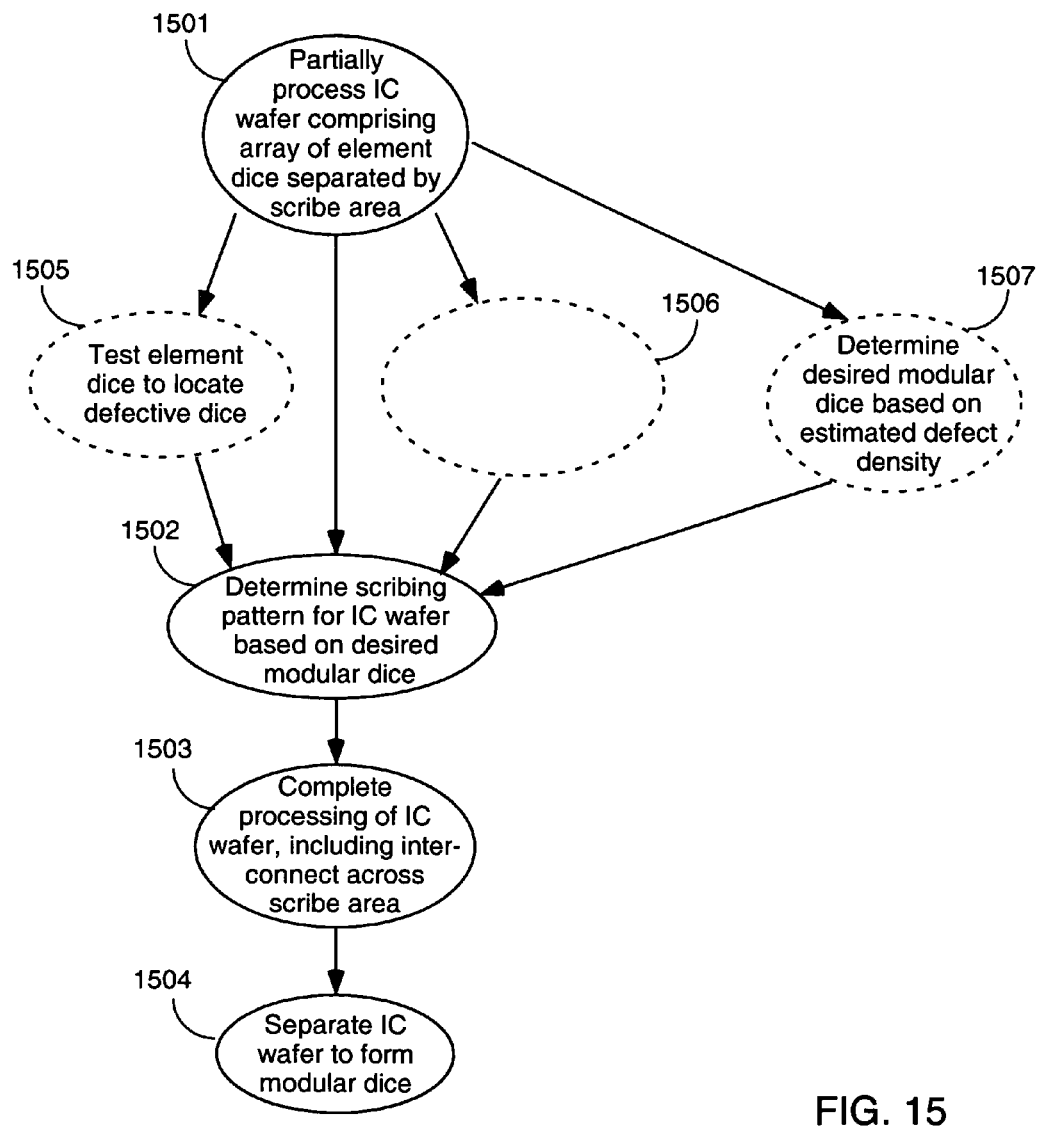
FIG. 15 illustrates the steps of a second exemplary method of manufacturing a modular IC, according to one embodiment.

In some embodiments, as shown in FIG. 15, for example, the wafer is initially only partially processed. The interconnect lines that cross the scribe lines are not included in the initial processing. Processing continues only after determining a scribing pattern for the wafer. A desirable scribing pattern can be determined, for example, based on test results identifying defective dice on the wafer, based on market demand, or utilizing an estimated defect density for the wafer. The wafer can also be stored, if desired, before continuing with the processing.

When processing resumes, the scribing pattern for the wafer has already been determined. Therefore, the number and location of the resulting modular ICs within the wafer are already known. In this embodiment, interconnect lines across the scribe line are included only between element dice within the same modular IC. This embodiment is well suited, for example, to ICs other than PLDs in which the interconnect lines that cross the scribe line can be expected to carry changing signal values. However, this embodiment can also be used for PLDs.

Note that in this embodiment, it might be desirable to limit the number of supported scribing patterns, because each scribing pattern requires separate masks for the remaining processing layers. This limitation on the number of scribing patterns available for use might result in reduced yield compared to the previously-described method in which interconnect lines are provided between all adjacent element dice.

FIG. 15 illustrates the steps of one method of manufacturing modular ICs, in which interconnect lines are provided across the scribe lines only within each modular IC. In step 1501, an IC wafer is partially processed. The IC wafer includes an array of element dice separated by a scribe area. The IC wafer is incompletely processed such that at least one interconnect layer is omitted.

In step 1502, a scribing pattern is determined for the IC wafer based at least in part on desired modular ICs to be provided from the IC wafer. Each desired modular IC includes at least one of the element dice.

In step 1503, the processing of the IC wafer is completed. In this step, the at least one interconnect layer is added. This interconnect layer includes interconnect lines that extend across the scribe area within each modular IC, between each adjacent pair of the element dice within the modular IC.

In step 1504, the IC wafer is separated into modular ICs as determined by the scribing pattern.

In some embodiments, after step 1501 and before step 1502, the element dice are tested (optional step 1505) to locate defective dice. The locations of the defective dice are taken account when the scribing pattern for the IC wafer is determined in step 1502.

In some embodiments, after step 1501 and before step 1502, the IC wafer is stored (optional step 1506) until information is received regarding the desired modular ICs.

In some embodiments, after step 1501 and before step 1502, the desired modular ICs are determined based on an estimated defect density for the IC wafer (optional step 1507). For example, a high estimated defect density might indicate that it is desirable to scribe the wafer for the smaller modular ICs, to improve the overall yield from the wafer. The defect density for the wafer might be estimated, for example, from measured defect densities obtained from other wafers in the same fabrication lot, or from test structures included on the same wafer.

Those having skill in the relevant arts of the invention will now perceive various modifications and additions that can be made as a result of the disclosure herein. For example, the above text describes the structures and methods of the invention in the context of PLDs such as FPGAs. However, the structures and methods of the invention can also be applied to non-programmable integrated circuits. The use of a PLD to illustrate the invention is purely exemplary. Further, the use of a particular type of PLD, the FPGA, is also exemplary.

Further, wafers, dice, PLDs, FPGAs, ICs, logic blocks, interconnect structures, programmable interconnect elements, configurable logic blocks, configurable logic elements, input/output blocks, scribe lines, and other elements other than those described herein can be used to implement the invention.

Accordingly, all such modifications and additions are deemed to be within the scope of the invention, which is to be limited only by the appended claims and their equivalents.

What is claimed is:

1. A modular integrated circuit (IC) wafer, comprising:
   an array comprising rows and columns of substantially similar element dice each comprising a programmable IC;
   a scribe area separating each row and each column of the element dice one from another, wherein the scribe area comprises interconnect lines extending across the scribe area between each adjacent pair of the element dice; and
   for each of the interconnect lines extending across the scribe area, a transistor situated at each end of the interconnect line and on each side of the scribe area, each of the transistors being coupled between an associated one of the interconnect lines and power high or ground, each of the transistors having a gate terminal connected to a programmable memory cell of the programmable IC.

2. The modular IC wafer of claim 1, wherein the element dice comprise programmable logic devices (PLDs).

3. The modular IC wafer of claim 2, wherein the PLDs comprise field programmable gate arrays (FPGAs).

4. The modular IC wafer of claim 2, wherein each PLD comprises a plurality of logic blocks, each of the logic blocks comprises a programmable interconnect element, and the interconnect lines extending across the scribe area couple a first programmable interconnect element in a first of the element dice to a second programmable interconnect element in a second of the element dice.

5. The modular IC wafer of claim 1, wherein each of the transistors comprises a pullup coupled between the associated interconnect line and power high.

6. The modular IC wafer of claim 1, wherein the array comprises exactly N rows and M columns of the element dice, N and M being positive integers, and wherein M is has a value selected from a group consisting of: one and two.

7. The modular IC wafer of claim 6, wherein N is has a value selected from a group consisting of: one, two, three, and four.

8. A modular integrated circuit (IC), comprising:
- an array comprising rows and columns of substantially similar element dice each comprising a programmable IC, the array being manufactured as an integral physical unit optionally separable into the element dice;
- a scribe area separating each row and each column of the element dice one from another, wherein the scribe area comprises interconnect lines extending across the scribe area between each adjacent pair of the element dice; and
- for each of the interconnect lines extending across the scribe area, a transistor situated at each end of the interconnect line and on each side of the scribe area, each of the transistors being coupled between an associated one of the interconnect lines and power high or ground, each of the transistors having a gate terminal connected to a programmable memory cell of the programmable IC.

9. The modular IC of claim 8, wherein the element dice comprise programmable logic devices (PLDs).

10. The modular IC of claim 9, wherein the PLDs comprise field programmable gate arrays (FPGAs).

11. The modular IC of claim 9, wherein each PLD comprises a plurality of logic blocks, each of the logic blocks comprises a programmable interconnect element, and the interconnect lines extending across the scribe area couple together the programmable interconnect elements in two of the element dice.

12. The modular IC of claim 8, wherein each of the transistors comprises a pullup coupled between the associated interconnect line and power high.

13. The modular IC of claim 8, wherein the array comprises exactly N rows and M columns of the element dice, N and M being positive integers, and wherein M is has a value selected from a group consisting of: one and two.

14. The modular IC of claim 13, wherein N is has a value selected from a group consisting of: one, two, three, and four.

* * * * *